(12) United States Patent
Miyazaki et al.

(10) Patent No.: US 6,919,217 B2
(45) Date of Patent: Jul. 19, 2005

(54) SEMICONDUCTOR LASER DEVICE FABRICATING METHOD

(75) Inventors: Keisuke Miyazaki, Ikoma (JP); Kazuhiko Wada, Yamatokooriyama (JP); Taiji Morimoto, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 79 days.

(21) Appl. No.: 10/412,297

(22) Filed: Apr. 14, 2003

(65) Prior Publication Data

US 2003/0194823 A1 Oct. 16, 2003

(30) Foreign Application Priority Data

Apr. 15, 2002 (JP) ........................................ 2002-112152

(51) Int. Cl.[7] .............................................. H01L 21/00
(52) U.S. Cl. ............................. 438/28; 438/34; 438/39
(58) Field of Search ............................. 438/28, 34, 35, 438/39, 40, 41, 46

(56) References Cited

U.S. PATENT DOCUMENTS

| | | | | |
|---|---|---|---|---|
| 5,898,722 A | * | 4/1999 | Ramdani et al. | 438/35 |
| 5,953,585 A | * | 9/1999 | Miyaguchi | 438/35 |
| 6,546,035 B2 | * | 4/2003 | Imafuji et al. | 438/22 |

FOREIGN PATENT DOCUMENTS

| | | |
|---|---|---|
| JP | 01-204487 | 8/1989 |
| JP | 03-009589 | 1/1991 |
| JP | 06-029618 | 2/1994 |
| JP | 10-233550 | 9/1998 |
| JP | 2000244060 | * 9/2000 |
| JP | 2000-299529 | 10/2000 |
| JP | 2001244572 | * 9/2001 |
| JP | 2001345514 | * 12/2001 |

* cited by examiner

Primary Examiner—Kevin M. Picardat
(74) Attorney, Agent, or Firm—Morrison & Foerster LLP

(57) ABSTRACT

An AlGaAs-based semiconductor laser 29 is formed on an n-type GaAs substrate 21, and thereafter, a non-doped GaAs protective layer 30 is formed. When the n-type substrate 21 is exposed by removing by etching a partial region of the AlGaAs-based semiconductor laser 29, an impurity Zn is prevented from evaporating from a p-type GaAs contact layer 28. The deterioration of the characteristic of contact with a p-type electrode as a consequence of a reduction in the carrier density of the p-type contact layer 28 can be prevented. Furthermore, the impurity evaporated from the p-type contact layer 28 can be prevented from readhering onto the exposed n-type substrate 21. A layer where the n-type GaAs substrate 21 and the readhering impurity are mixed with each other is not formed when an AlGaInP-based semiconductor laser 38 is succeedingly formed, and the reliability in long-term operation can be improved.

9 Claims, 6 Drawing Sheets

FIRST-TIME CRYSTAL GROWTH

PARTIAL REMOVAL OF FIRST-TIME CRYSTAL GROWTH LAYER

ETCHANT OF SULFURIC ACID SYSTEM
ETCHANT OF HF SYSTEM OR HYDROCHLORIC ACID SYSTEM
ETCHANT OF SULFURIC ACID SYSTEM OR $NH_3$ SYSTEM

SECOND-TIME CRYSTAL GROWTH

PARTIAL REMOVAL OF SECOND-TIME CRYSTAL GROWTH LAYER

SEPARATION BETWEEN FIRST-TIME AND SECOND-TIME GROWTH LAYERS

FORMATION OF LIGHT CONFINEMENT STRUCTURE, CURRENT CONFINEMENT STRUCTURE AND ELECTRODES

SEMICONDUCTOR LASER DEVICE FABRICATING METHOD

BACKGROUND OF THE INVENTION

The present invention relates to a semiconductor laser device fabricating method capable of forming a plurality of semiconductor lasers on one semiconductor substrate.

In recent years, optical disks have been popularized, and their recording formats have had many divergences. When optical disks of different standards are optically read, lasers of different standards are needed. For example, in order to read two types of optical discs of a CD (Compact Disc) and a DVD (Digital Versatile Disc), an infrared laser of an emission wavelength at and around 780 nm and a red laser of an emission wavelength at and around 650 nm are needed.

In the above case, there is demanded the appearance of a semiconductor laser device capable of emitting laser beams of two wavelengths in one package for the size reduction and cost reduction of the pickup.

Moreover, besides the optical disks, there is demanded the appearance of a semiconductor laser device capable of emitting laser beams of two wavelengths in one package or two kinds of lasers for a low output use and a high output use even at same wavelength for laser beam printers and rewritable optical disks. Furthermore, a two-beam laser device of same wavelength and same output can be considered.

In order to meet these demands, a technology for integrating two semiconductor lasers on one semiconductor substrate is developed. However, when lasers of two different characteristics are formed on a single semiconductor substrate, it is often impossible to materialize such a device through one-time crystal growth. Therefore, a method for carrying out crystal growth a plurality of times on a single semiconductor substrate is used. That is, one laser structure is precedingly crystallinically grown on a semiconductor substrate, the other laser structure is formed while being superposedly grown on it, and the succeedingly formed laser structure is removed from the precedingly grown laser structure.

However, the aforementioned conventional semiconductor laser device fabricating method for performing crystal growth a plurality of times on a single semiconductor substrate has the following problems. That is, when the other laser structure is formed while being superposedly grown on the laser structure precedingly grown on the semiconductor substrate, electrode contact with the precedingly grown laser structure cannot be sufficiently achieved. Furthermore, there is caused such a problem that abnormality occurs in the current-to-voltage characteristic of the subsequently grown laser structure.

Explaining in concrete, in order to achieve the electrode contact with a low resistance, the contact layer is formed with a high carrier density. Then, in order to provide this carrier density, an impurity is added into the crystal layer that constitutes the contact layer. Therefore, the impurity slips out of the contact layer under the influence of a high temperature occurring when the other laser structure is grown while being superposed on the laser structure in which the contact layer has been formed, and the carrier density of the contact layer is reduced, deteriorating the characteristic of contact between the metal electrode and the semiconductor layer.

Further, the impurity, which has slipped out of the contact layer, readheres to the crystal surface exposed for the growth of the other laser, and the crystal growth of the other laser is carried out on it. Therefore, a needless layer mixed with the undesired impurity is to be formed, and this influences the resistivity and the conductive type of the layer, consequently causing the appearance of abnormality in the current-to-voltage characteristic.

FIGS. 5A and 5B show the cross section of the device when two semiconductor lasers of an AlGaAs-based semiconductor laser and an AlGaInP-based semiconductor laser are grown on a GaAs substrate 1. First of all, as shown in FIG. 5A, an AlGaAs-based semiconductor laser 9 constructed of an n-type GaAs buffer layer 2, an n-type AlGaAs clad layer 3, an AlGaAs guide layer 4, a multiple quantum well active layer 5, a p-type AlGaAs guide layer 6, a p-type AlGaAs clad layer 7, and a p-type GaAs contact layer (doped with Zn at a concentration of $5 \times 10^{18}$ cm$^{-3}$) 8 is grown on an n-type GaAs substrate 1. Then, the AlGaAs-based semiconductor laser 9 is partially removed by etching until the GaAs substrate 1 is exposed.

Then, the layered structure is next put in a growth furnace to grow the AlGaInP-based semiconductor laser. Then, as schematically shown in FIG. 5A, the impurity Zn evaporates from the p-type GaAs contact layer 8 of the uppermost layer due to a high temperature in the furnace and readheres onto the exposed GaAs substrate 1.

Thereafter, as shown in FIG. 5B, an AlGaInP-based semiconductor laser 18 constructed of an n-type GaAs buffer layer 11, an n-type AlGaInP clad layer 12, an AlGaInP guide layer 13, a multiple quantum well active layer 14, an AlGaInP guide layer 15, a p-type AlGaInP clad layer 16 and a p-type GaAs contact layer 17 is grown on the entire surface.

FIG. 6 shows the carrier density immediately after the growth of the p-type GaAs contact layer 8 located on the AlGaAs-based semiconductor laser 9 side and the carrier density after growth of the AlGaInP-based semiconductor laser 18. According to the figure, it can be understood that the carrier density, which has been $5 \times 10^{18}$ cm$^{-3}$ immediately after the formation of the AlGaAs-based semiconductor laser 9, is reduced to $7 \times 10^{17}$ cm$^{-3}$ on the outermost surface after the growth of the AlGaInP-based semiconductor laser 18.

Moreover, FIG. 7 shows the current-to-voltage curve of the subsequently grown AlGaInP-based semiconductor laser 18. It is to be noted that a current-to-voltage curve when an AlGaInP-based semiconductor laser of the same composition as that of this AlGaInP-based semiconductor laser 18 is singly grown on a GaAs substrate is also additionally shown. FIG. 7 indicates that the driving voltage with a current of 100 mA, which has been 1.82 V in the single unit, is increased by 0.1 V to become 1.92 V in the case of the subsequently grown AlGaInP-based semiconductor laser 18. This means that a layer where the GaAs substrate 1 is mixed with the readhering impurity Zn is formed at the interface between the lowermost GaAs buffer layer 11 of the AlGaInP-based semiconductor laser 18 and the GaAs substrate 1, and the internal resistance is increased, causing an increased heating value. In the above case, a problem occurs in terms of reliability in long-term operation.

SUMMARY OF THE INVENTION

Accordingly, the object of this invention is to provide a semiconductor laser device fabricating method capable of forming a semiconductor laser device having satisfactory characteristics by successively growing a plurality of semiconductor lasers on a single semiconductor substrate.

In order to achieve the aforementioned object, there is provided a semiconductor laser device fabricating method for forming a semiconductor laser device having a plurality of light-emitting regions, the method comprising the steps of:

forming on a semiconductor substrate a first semiconductor laser layer including a contact layer located in an uppermost position by first-time crystal growth;

forming a non-doped semiconductor layer on the contact layer of the first semiconductor laser layer;

exposing the semiconductor substrate by removal except for a region, which becomes a light-emitting region of the first semiconductor laser layer on which the non-doped semiconductor layer is formed;

forming a second semiconductor laser layer by second-time crystal growth; and exposing the contact layer of the first semiconductor laser layer by removing a region of the second semiconductor laser layer except for a region that becomes a light-emitting region and the non-doped semiconductor layer.

According to this semiconductor laser device fabricating method, the first semiconductor laser layer is formed on the semiconductor substrate by the first-time crystal growth, and thereafter, the non-doped semiconductor layer is formed on the uppermost contact layer of the first semiconductor laser layer. Therefore, when the semiconductor substrate is exposed by removal except for the region that becomes the light-emitting region of the first semiconductor laser layer prior to the formation of the second semiconductor laser layer by the second-time crystal growth, the non-doped semiconductor layer functions as a protective layer of the contact layer.

As a result, when the device is put in a growth furnace to carry out the second-time crystal growth, the evaporation of the impurity from the contact layer due to high temperature in the furnace is prevented. Accordingly, there is no possibility of the deterioration of the characteristic of contact with the metal electrode as a consequence of a reduction in the carrier density of the contact layer.

Further, the impurity evaporated from the contact layer does not readhere to the surface of the exposed semiconductor substrate. Accordingly, there is no possibility of the formation of a layer where the semiconductor substrate is mixed with the readhering impurity at the interface between the lowermost layer of the second semiconductor laser layer and the semiconductor substrate when the second semiconductor laser layer is formed on the exposed semiconductor substrate by the second-time crystal growth. Thus, the reliability in long-term operation is improved.

Moreover, in one embodiment, at least the step of forming the non-doped semiconductor layer, the step of exposing the semiconductor substrate and the step of forming the second semiconductor laser layer are repetitively carried out. Therefore, by regarding the second semiconductor laser layer formed by the second-time crystal growth as the first semiconductor laser layer formed by the first-time crystal growth, forming the non-doped semiconductor layer on this first semiconductor laser layer (originally the second semiconductor laser layer), exposing the semiconductor substrate and thereafter forming the second semiconductor laser layer (originally the third semiconductor laser layer), three semiconductor lasers having high performance and high reliability can be formed on an identical semiconductor substrate.

Moreover, in one embodiment, the semiconductor layer of a crystal composition different from those of the contact layer and the non-doped semiconductor layer is formed between the contact layer and the non-doped semiconductor layer of the first semiconductor laser layer. Therefore, by removing by etching the semiconductor layer of the different crystal composition with an etchant having selectivity to the contact layer when the contact layer is exposed after the formation of the second semiconductor laser layer, the etching is reliably stopped at the surface of the contact layer. Therefore, the thickness of the contact layer is strictly controlled, and the prescribed contact characteristic can be obtained.

Moreover, in one embodiment, the AlGaAs-based semiconductor layer is formed as the semiconductor layer of the different crystal composition between the contact layer and the non-doped semiconductor layer of the first semiconductor laser layer. Therefore, assuming that the contact layer is, for example, a GaAs-based contact layer, then the thickness of the GaAs-based contact layer is strictly controlled by using an etchant of HF system or hydrochloric acid system having selectivity to the GaAs-based contact layer when the semiconductor layer of the different crystal composition is removed by etching.

Moreover, in one embodiment, a GaAs-based semiconductor layer is formed as the non-doped semiconductor layer. Therefore, in the case of the semiconductor laser device fabricating method for forming the semiconductor layer of the different crystal composition on the contact layer of the first semiconductor laser layer and forming the non-doped semiconductor layer on the contact layer, assuming that the contact layer is a GaAs-based contact layer and the semiconductor layer of the different crystal composition is an AlGaAs-based semiconductor layer, then the thickness of the GaAs-based contact layer is strictly controlled by using an etchant of HF system or hydrochloric acid system having selectivity to the GaAs-based contact layer when the semiconductor layer of the different crystal composition is removed by etching.

Moreover, in one embodiment, the layer thickness of the GaAs-based non-doped semiconductor layer is not smaller than 0.2 $\mu$m. Therefore, the GaAs-based non-doped semiconductor layer does not evaporate by high temperature before the formation of the second semiconductor laser layer by the second-time crystal growth. The evaporation of the impurity from the contact layer of the first semiconductor laser layer due to the high temperature is reliably prevented, and the non-doped semiconductor layer is easily removed by etching when the contact layer of the first semiconductor laser layer is exposed. Moreover, the layer thickness of the AlGaAs-based semiconductor layer is not smaller than 0.1 $\mu$m. Therefore, the function of the etching stop layer when the GaAs-based non-doped semiconductor layer is removed by etching is sufficiently put into effect, and the etching stop layer is easily removed by etching when the contact layer of the first semiconductor laser layer is exposed.

Moreover, in one embodiment, a GaAs-based contact layer is formed as the contact layer of the first semiconductor laser layer. Therefore, in the case of the semiconductor laser device fabricating method for forming the semiconductor layer of different crystal composition on the contact layer and forming the non-doped semiconductor layer on the semiconductor layer of different crystal composition, assuming that the semiconductor layer of the different composition is, for example, the AlGaAs-based semiconductor layer, then the thickness of the GaAs-based contact layer is strictly controlled by using an etchant of HF system or hydrochloric acid system having selectivity to the GaAs-based contact layer when the semiconductor layer of the different crystal composition is removed by etching.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
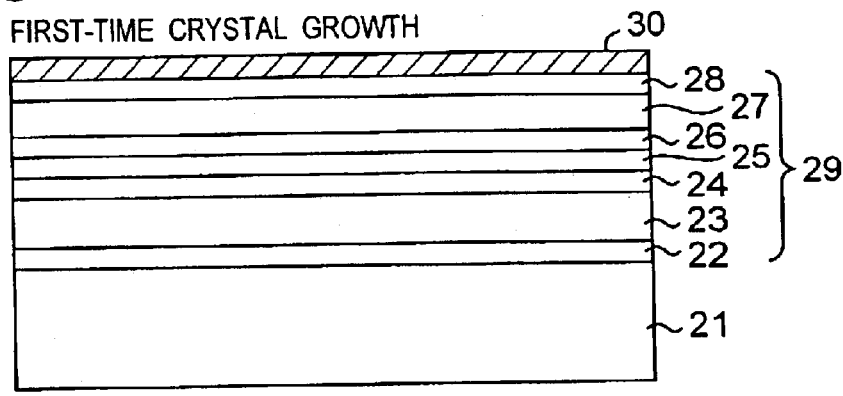
FIGS. 1A through 1C are sectional views of a semiconductor laser device formed by the semiconductor laser device fabricating method of this invention in the fabricating processes of the device.

This invention will be described in detail below on the basis of the embodiments shown in the drawings.
(First Embodiment)

FIGS. 1A through 1C and 2D through 2F show the cross sections of a semiconductor laser device in the fabricating processes, the device being formed by the semiconductor laser device fabricating method of this embodiment. First of all, as shown in FIG. 1A, an n-type GaAs buffer layer 22, an n-type AlGaAs clad layer 23, an AlGaAs guide layer 24, a multiple quantum well active layer 25, a p-type AlGaAs guide layer 26, a p-type AlGaAs clad layer 27 and a p-type GaAs contact layer 28 are successively formed on an n-type GaAs substrate 21 by MOCVD (Metal-Organic Chemical Vapor Deposition), forming an AlGaAs-based semiconductor laser 29 as one example of the first semiconductor laser layer. In the above case, the uppermost p-type GaAs contact layer 28 is doped with Zn so that the carrier density becomes $5 \times 10^{18}$ cm$^{-3}$.

Further, a non-doped GaAs protective layer 30, which serves as one example of the non-doped semiconductor layer, is formed to a film thickness of 0.2 μm on the p-type GaAs contact layer 28 of the AlGaAs-based semiconductor laser 29. Thus, first-time crystal growth is carried out.

Figure 1B:
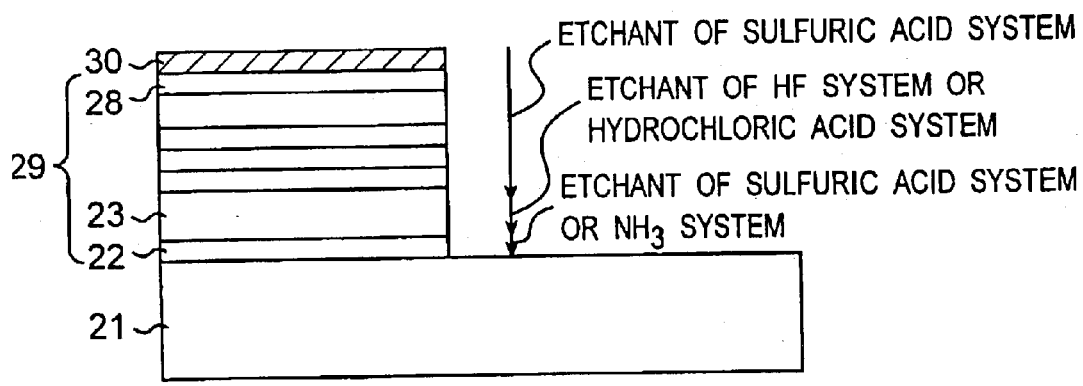

Next, as shown in FIG. 1B, a partial region of the AlGaAs-based semiconductor laser 29 is removed by etching to expose the n-type GaAs substrate 21. In concrete, etching is first carried out with an etchant of sulfuric acid system until reaching the n-type AlGaAs clad layer 23. Next, the remaining n-type AlGaAs clad layer 23 is removed by etching with an etchant of HF system or hydrochloric acid system. Since GaAs cannot be etched with the above-mentioned etchant, the etching stops at the surface of the n-type GaAs buffer layer 22. Accordingly, by subsequently removing the n-type GaAs buffer layer 22 with an etchant of sulfuric acid system or NH$_3$ system to expose the n-type GaAs substrate 21.

In this case, the non-doped GaAs protective layer 30 is formed on the p-type GaAs contact layer 28 of the AlGaAs-based semiconductor laser 29 remaining on the n-type GaAs substrate 21. Therefore, when the n-type GaAs substrate 21 is put in a growth furnace for growing the AlGaInP-based semiconductor laser, the evaporation of the impurity Zn from the p-type GaAs contact layer 28 due to high temperature in the furnace is prevented. Further, no dopant is contained in the non-doped GaAs protective layer 30. As a result, impurities such as the impurity Zn evaporated from the p-type GaAs contact layer 28 are prevented from readhering onto the surface of the exposed GaAs substrate 21.

Figure 1C:
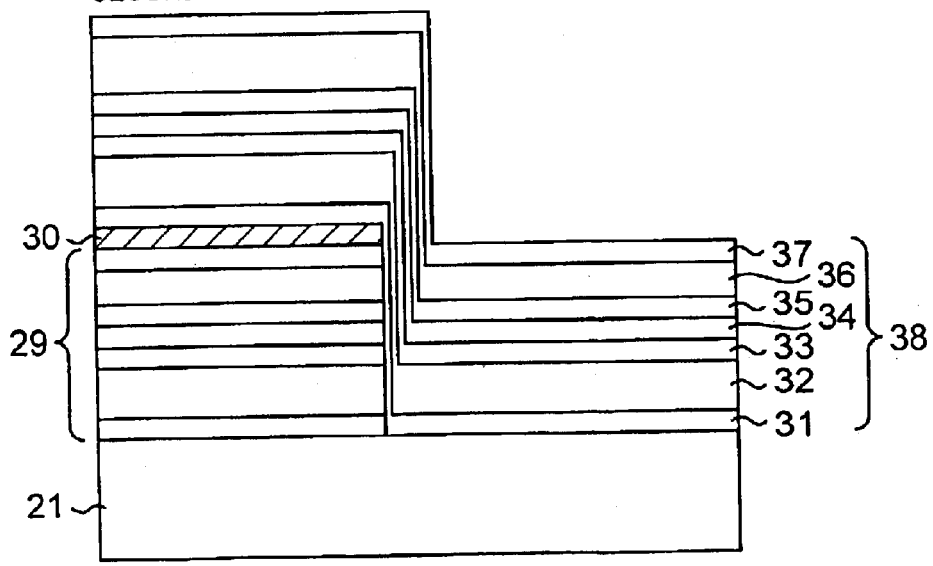

Next, as shown in FIG. 1C, an n-type GaAs buffer layer 31, an n-type AlGaInP clad layer 32, an AlGaInP guide layer 33, a multiple quantum well active layer 34, an AlGaInP guide layer 35, a p-type AlGaInP clad layer 36 and a p-type GaAs contact layer 37 are successively formed on the entire surface by MOCVD, forming an AlGaInP-based semiconductor laser 38 as one example of the second semiconductor laser layer. Thus, second-time crystal growth is carried out. In FIG. 1C, the layers are illustrated so as to be bent at right angles and perpendicularly extended at the boundary between the AlGaInP-based semiconductor laser 38 grown on the GaAs substrate 21 and the AlGaInP-based semiconductor laser 38 grown on the AlGaAs-based semiconductor laser 29. However, the layers are practically formed so as to be gently curved.

Figure 2D:
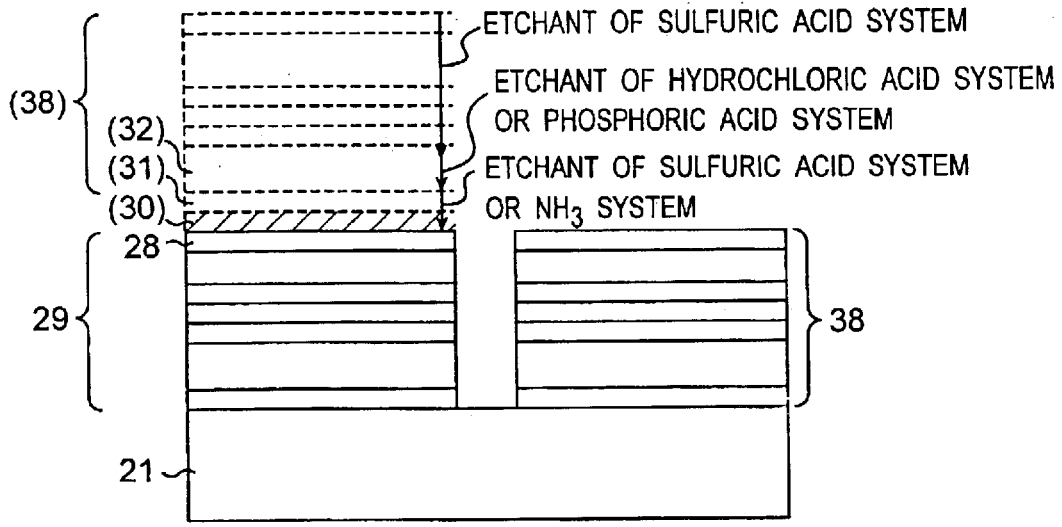
FIGS. 2D through 2F are sectional views in the fabricating processes continued from FIG. 1C.

Next, as shown in FIG. 2D, a region, which belongs to the succeedingly formed AlGaInP-based semiconductor laser 38 and is formed while being superposed on the precedingly formed AlGaAs-based semiconductor laser 29, and the non-doped GaAs protective layer 30 are removed by etching.

In concrete, etching is first carried out until reaching the n-type AlGaInP clad layer 32 of the AlGaInP-based semiconductor laser 38 with an etchant of sulfuric acid system. Next, the remaining n-type AlGaInP clad layer 32 is etched to the n-type GaAs buffer layer 31 with an etchant of hydrochloric acid system or phosphoric acid system. In this case, since the etchant having selectivity is used, the etching stops on the n-type GaAs buffer layer 31. Subsequently, the n-type GaAs buffer layer 31 and the non-doped GaAs protective layer 30 are removed by etching with an etchant of sulfuric acid system or an etchant of NH$_3$ system to expose the p-type GaAs contact layer 28 of the AlGaAs-based semiconductor laser 29.

Figure 2E:
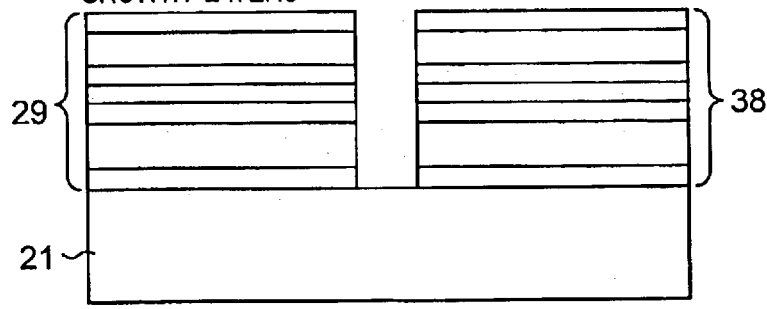

Further, a region located at the boundary between the AlGaAs-based semiconductor laser 29 and the AlGaInP-based semiconductor laser 38 on the n-type GaAs substrate 21 is removed, forming a semiconductor laser device in which the AlGaAs-based semiconductor laser 29 and the AlGaInP-based semiconductor laser 38 are arranged parallel on the n-type GaAs substrate 21, as shown in FIG. 2E.

Figure 2F:
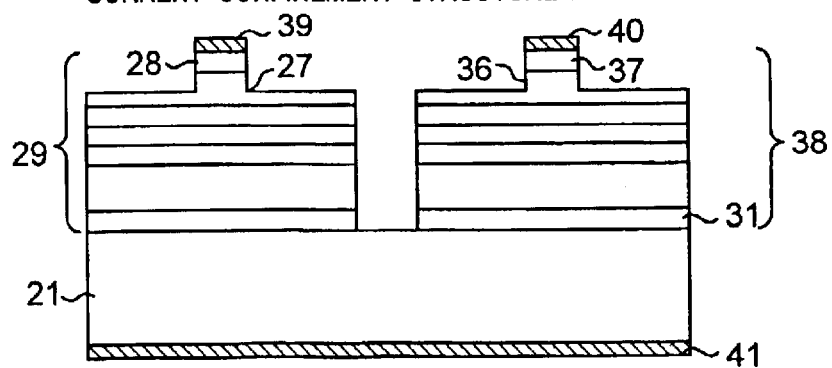

Subsequently, as shown in FIG. 2F, the p-type GaAs contact layer 28 and the p-type AlGaAs clad layer 27 of the AlGaAs-based semiconductor laser 29 are removed by etching entirely and partway, respectively, with a center portion left by a prescribed width in the direction perpendicular to the sheet plane of the figure, forming a stripe-shaped ridge portion in the center portion. At the same time, the p-type GaAs contact layer 37 and the p-type AlGaInP clad layer 36 of the AlGaInP-based semiconductor laser 38 are removed by etching entirely and partway, respectively, forming a stripe-shaped ridge portion in the center portion. Then, p-type AuZn/Au/Mo/Au electrodes 39 and 40 are formed on the ridge portion of the AlGaAs-based semiconductor laser 29 and on the ridge portion of the AlGaInP-based semiconductor laser 38. Further, an n-type AuGe/Ni/Mo/Au electrode 41 is formed on the surface of the n-type GaAs substrate 21. Thus, the semiconductor laser device, which has two light-emitting portions, is formed.

In the thus-formed semiconductor laser device, the impurity Zn does not evaporate from the p-type GaAs contact layer 28 of the AlGaAs-based semiconductor laser 29. Therefore, the surface carrier density of the p-type GaAs contact layer 28 maintains $5 \times 10^{18}$ cm$^{-3}$, and a satisfactory electrode contact can be obtained. Furthermore, there is also no readhesion of the impurity Zn to the n-type GaAs substrate 21. Therefore, the I–V characteristic of the subsequently grown AlGaInP-based semiconductor laser 38 is no different from that of the singly grown AlGaInP-based semiconductor laser of the same composition.

As described above, in the present embodiment, the AlGaAs-based semiconductor laser 29 is formed on the n-type GaAs substrate 21, and thereafter, the non-doped GaAs protective layer 30 is formed on the uppermost p-type GaAs contact layer 28 of the AlGaAs-based semiconductor laser 29. Therefore, when the n-type GaAs substrate 21 is exposed by removing by etching the partial region of the AlGaAs-based semiconductor laser 29 and thereafter the n-type GaAs substrate 21 is put in the growth furnace for growing the AlGaInP-based semiconductor laser, the evaporation of the impurity Zn from the p-type GaAs contact layer 28 due to high temperature in the furnace can be prevented. Therefore, it is feasible to prevent the characteristic of contact with the p-type AuZn/Au/Mo/Au electrode 39 from deteriorating as a consequence of a reduction in the carrier density of the p-type GaAs contact layer 28.

Furthermore, the impurity Zn evaporated from the p-type GaAs contact layer 28 can be prevented from readhering to the surface of the exposed GaAs substrate 21. Accordingly, there is no possibility of the formation of the layer where the readhering impurity Zn is mixed with the GaAs substrate 21 at the interface between the lowermost n-type GaAs buffer layer 31 of the AlGaInP-based semiconductor laser 38 and the GaAs substrate 21 when the AlGaInP-based semiconductor laser 38 is formed on the GaAs substrate 21 in the region from which the AlGaAs-based semiconductor laser 29 is removed. Accordingly, there is no possibility of an increase in the heating value as a consequence of an increase in the internal resistance, and the reliability in long-term operation can be improved.

In the above case, the film thickness of the non-doped GaAs protective layer 30 is set at 0.2 μm. Therefore, the evaporation of the impurity Zn from the GaAs contact layer 28 of the AlGaAs-based semiconductor laser 29 due to high temperature in the growth furnace can reliably be prevented, and the non-doped GaAs protective layer can easily be removed by etching when the GaAs contact layer 28 is exposed.

Although the film thickness of the non-doped GaAs protective layer 30 is set at 0.2 μm in the first embodiment, the present invention is not limited to this. What is essential is that the film thickness is only required to be not evaporated by high temperature before the AlGaInP-based semiconductor laser 38 is grown by the second-time crystal growth and required to be not smaller than 0.2 μm. Although there is no specific limitation on the upper limit, the proper thickness is practically not greater than 2 μm.

(Second Embodiment)

The present embodiment is related to a fabricating method of a semiconductor laser device having two light-emitting portions of an AlGaAs-based semiconductor laser and an AlGaInP-based semiconductor laser, different from that of the first embodiment.

Figure 3A:
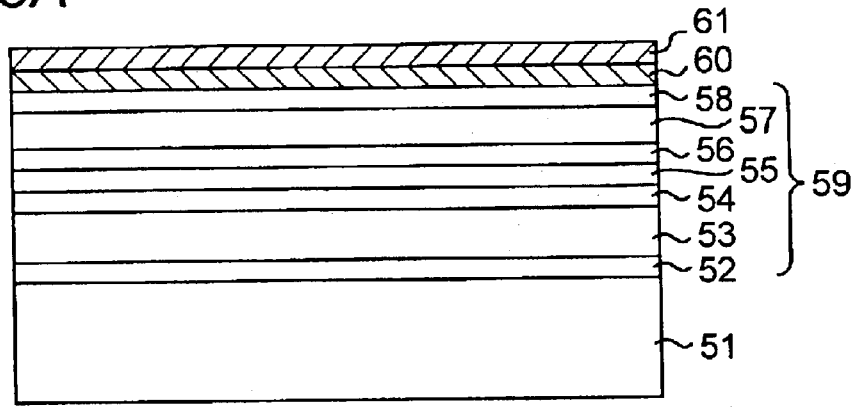
FIGS. 3A through 3C are sectional views of a semiconductor laser device formed by a semiconductor laser device fabricating method different from that of FIGS. 1A through 1C and 2D through 2F in the fabricating processes of the device.

FIGS. 3A through 3C and 4D through 4F show the cross sections of a semiconductor laser device formed by the semiconductor laser device fabricating method of the present embodiment, in the fabricating processes of the device. First of all, as shown in FIG. 3A, an n-type GaAs buffer layer 52, an n-type AlGaAs clad layer 53, an AlGaAs guide layer 54, a multiple quantum well active layer 55, a p-type AlGaAs guide layer 56, a p-type AlGaAs clad layer 57 and a p-type GaAs contact layer 58 are successively formed on an n-type GaAs substrate 51 by MOCVD, forming an AlGaAs-based semiconductor laser 59. In the above case, the p-type GaAs contact layer 58 is doped with Zn so that the carrier density becomes $5 \times 10^{18}$ cm$^{-3}$.

Further, a non-doped AlGaAs etching stop layer 60, which has a film thickness of 0.1 μm and serves as one example of the semiconductor layer of a crystal composition different from those of the contact layer and the non-doped semiconductor layer, and a non-doped GaAs protective layer 61 having a film thickness of 0.2 μm are grown on the p-type GaAs contact layer 58 of the AlGaAs-based semiconductor laser 59. Thus, first-time crystal growth is carried out.

Figure 3B:
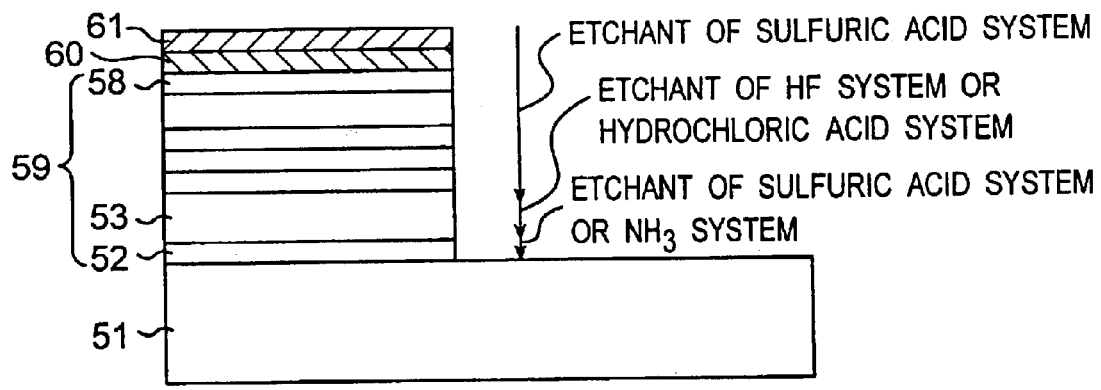

Next, as shown in FIG. 3B, a partial region of the AlGaAs-based semiconductor laser 59 is removed by etching to expose the n-type GaAs substrate 51. In concrete, etching is first carried out until reaching the n-type AlGaAs clad layer 53 with an etchant of sulfuric acid system. Next, the remaining n-type AlGaAs clad layer 53 is removed by etching with an etchant of HF system or hydrochloric acid system. Since GaAs cannot be etched with the above etchant, the etching stops at the surface of the n-type GaAs buffer layer 52. Accordingly, by subsequently removing by etching the n-type GaAs buffer layer 52 with an etchant of sulfuric acid system or NH$_3$ system to expose the n-type GaAs substrate 51.

In this case, the non-doped AlGaAs etching stop layer 60 and the non-doped GaAs protective layer 61 are grown on the p-type GaAs contact layer 58, which belongs to the AlGaAs-based semiconductor laser 59 and is remaining on the n-type GaAs substrate 51. Therefore, when the n-type GaAs substrate is put in a growth furnace for growing the AlGaInP-based semiconductor laser, the evaporation of the impurity Zn from the p-type GaAs contact layer 58 due to high temperature in the furnace is prevented. Further, no dopant is contained in the non-doped GaAs protective layer 61. As a result, impurities such as the impurity Zn evaporated from the p-type GaAs contact layer 58 are prevented from readhering onto the surface of the exposed GaAs substrate 51.

Figure 3C:
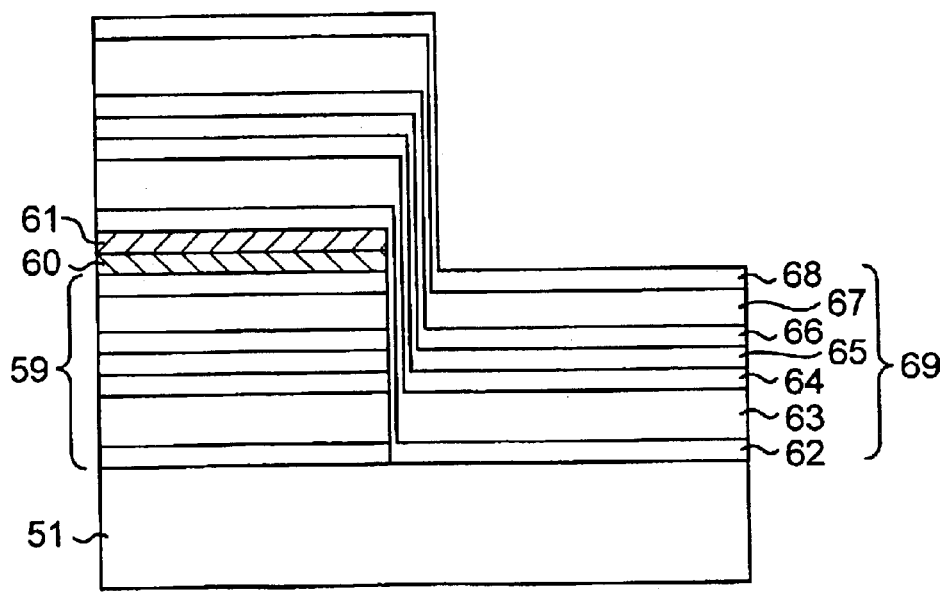

Next, as shown in FIG. 3C, an n-type GaAs buffer layer 62, an n-type AlGaInP clad layer 63, an AlGaInP guide layer 64, a multiple quantum well active layer 65, an AlGaInP guide layer 66, a p-type AlGaInP clad layer 67 and a p-type GaAs contact layer 68 are successively grown on the entire surface by MOCVD, forming an AlGaInP-based semiconductor laser 69. Thus, second-time crystal growth is carried out.

Figure 4D:
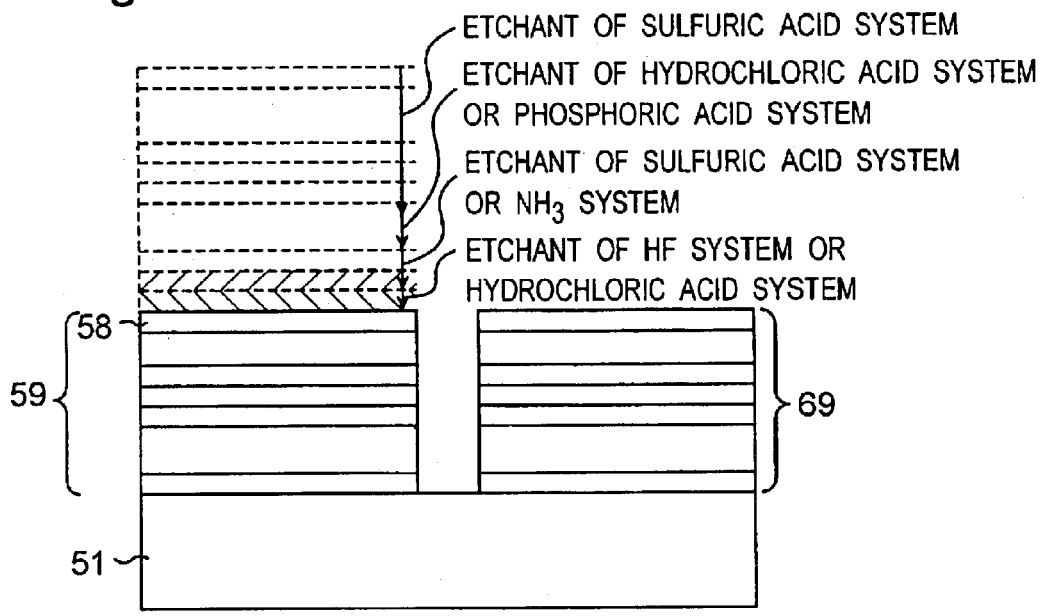
FIGS. 4D through 4F are sectional views in the fabricating processes continued from FIG. 3C.

Next, as shown in FIG. 4D, a region, which belongs to the AlGaInP-based semiconductor laser 69 and is formed while being superposed on the precedingly formed AlGaAs-based semiconductor laser 59, the non-doped AlGaAs etching stop layer 60 and the non-doped GaAs protective layer 61 are removed by etching.

In concrete, etching is first carried out until reaching the n-type AlGaInP clad layer 63 of the AlGaInP-based semiconductor laser 69 with an etchant of sulfuric acid system. Next, the remaining n-type AlGaInP clad layer 63 is etched to the n-type GaAs buffer layer 62 with an etchant of hydrochloric acid system or phosphoric acid system. In this case, since the etchant having selectivity is used, the etching stops on the n-type GaAs buffer layer 62. Subsequently, the n-type GaAs buffer layer 62 and the non-doped GaAs protective layer 61 are removed by etching with an etchant of sulfuric acid system or $NH_3$ system. In this case, since the etchant of sulfuric acid system or $NH_3$ system is used, the etching stops when the non-doped AlGaAs etching stop layer 60 is exposed. Subsequently, the non-doped AlGaAs etching stop layer 60 is removed with an etchant of HF system or hydrochloric acid system. Thus, the p-type GaAs contact layer 58 of the AlGaAs-based semiconductor laser 59 is exposed.

Figure 4E:
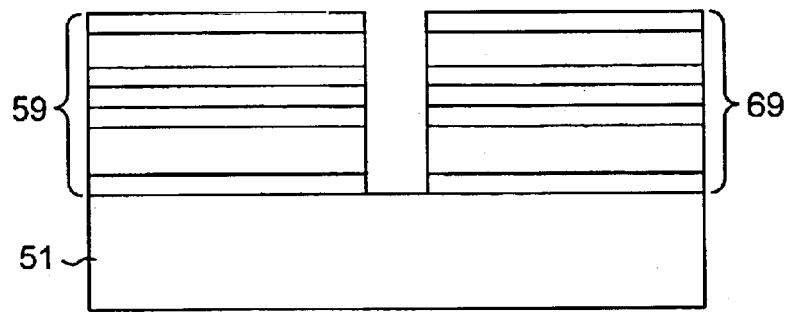

Further, a portion located at the boundary between the AlGaAs-based semiconductor laser 59 and the AlGaInP-based semiconductor laser 69 on the n-type GaAs substrate 51 is removed, forming a semiconductor laser device in which the AlGaAs-based semiconductor laser 59 and the AlGaInP-based semiconductor laser 69 are arranged parallel on the n-type GaAs substrate 51, as shown in FIG. 4E.

Figure 4F:
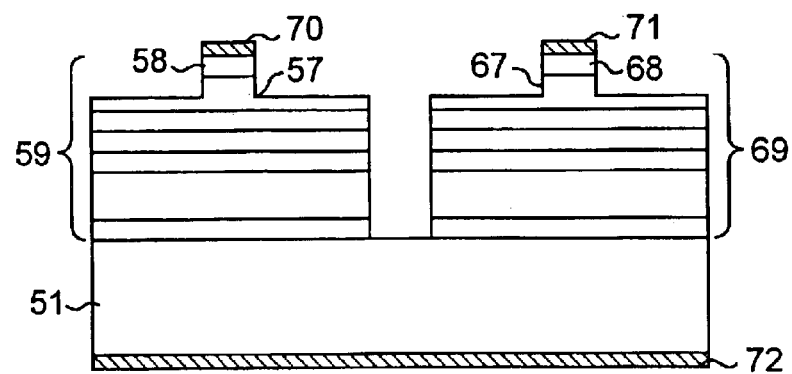
Figure 5A:
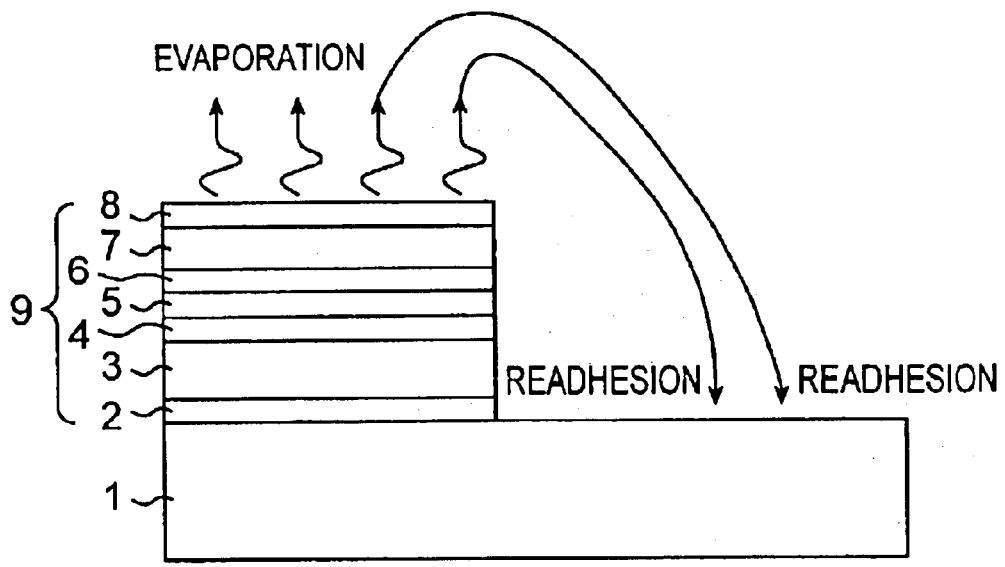
FIGS. 5A and 5B are sectional views of a device in the case where two semiconductor lasers are grown on a substrate by a background art.
Figure 5B:
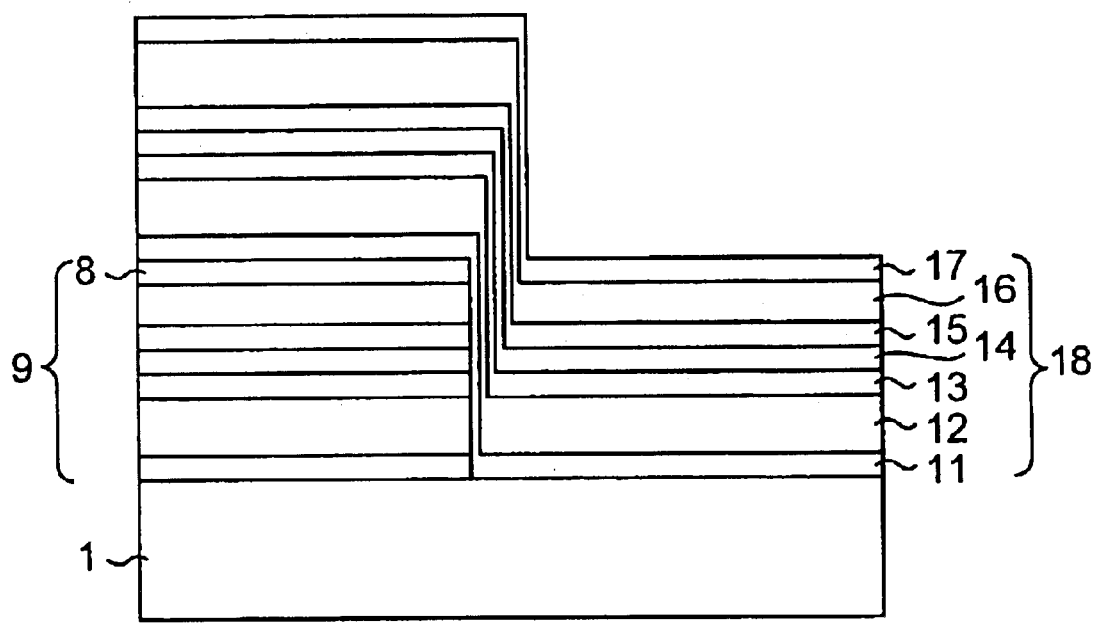
Figure 6:
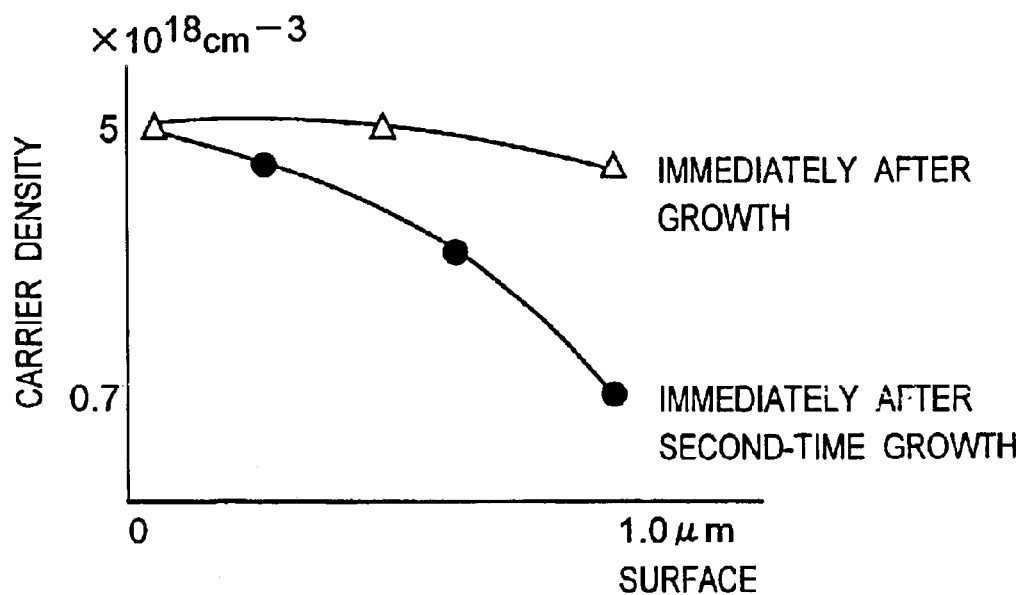
FIG. 6 is a graph showing the carrier density immediately after the growth of a p-type GaAs contact layer located on the precedingly formed AlGaAs-based semiconductor laser side and the carrier density after the growth of the AlGaInP-based semiconductor laser.
Figure 7:
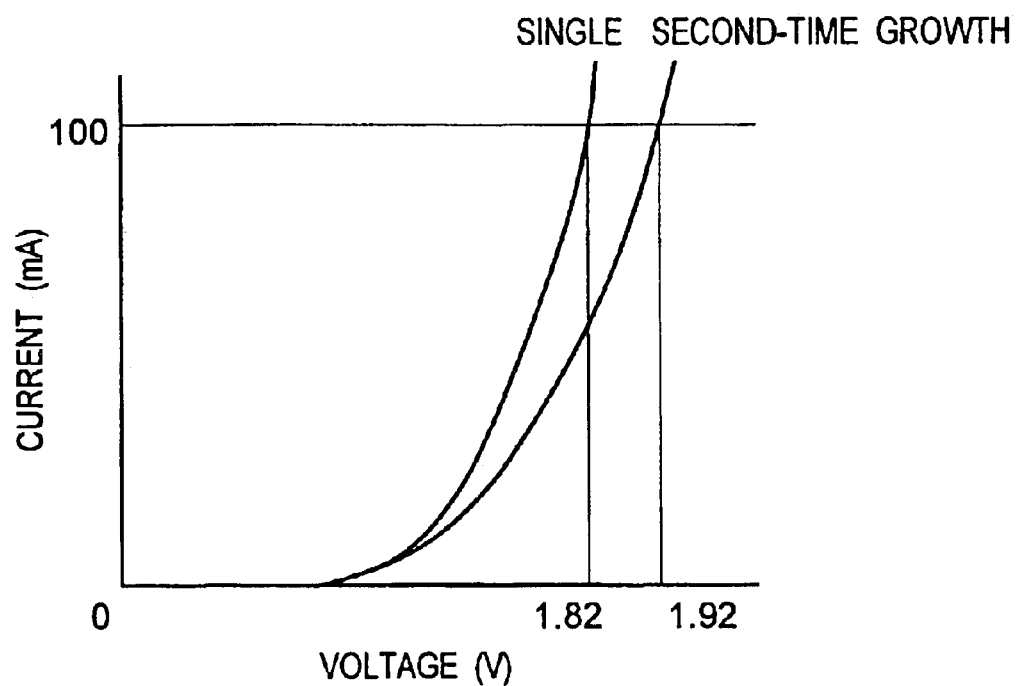
FIG. 7 is a graph showing the current-to-voltage curve of the subsequently grown AlGaInP-based semiconductor laser.

Subsequently, as shown in FIG. 4F, the p-type GaAs contact layer 58 and the p-type AlGaAs clad layer 57 of the AlGaAs-based semiconductor laser 59 are removed by etching entirely and partway, respectively, forming a ridge portion similarly to the case of the first embodiment. At the same time, the p-type GaAs contact layer 68 and the p-type AlGaInP clad layer 67 of the AlGaInP-based semiconductor laser 69 are removed by etching entirely and partway, respectively, forming a ridge portion. Then, p-type AuZn/Au/Mo/Au electrodes 70 and 71 are formed on the ridge portion of the AlGaAs-based semiconductor laser 59 and on the ridge portion of the AlGaInP-based semiconductor laser 69. Further, an n-type AuGe/Ni/Mo/Au electrode 72 is formed on the surface of the n-type GaAs substrate 51. Thus, the semiconductor laser device, which has two light-emitting portions, is formed.

As described above, in the present embodiment, the AlGaAs-based semiconductor laser 59 is formed on the n-type GaAs substrate 51, and thereafter, the non-doped AlGaAs etching stop layer 60 having a film thickness of 0.1 μm and the non-doped GaAs protective layer 61 having a film thickness of 0.2 μm are formed on the uppermost p-type GaAs contact layer 58 of the AlGaAs-based semiconductor laser 59. Therefore, when the n-type GaAs substrate 51 is exposed by removing by etching the partial region of the AlGaAs-based semiconductor laser 59 and thereafter the n-type GaAs substrate is put in the growth furnace for growing the AlGaInP-based semiconductor laser, the evaporation of the impurity Zn from the p-type GaAs contact layer 58 due to high temperature in the furnace can be prevented. Therefore, it is feasible to prevent the characteristic of contact with the p-type AuZn/Au/Mo/Au electrode 70 can be prevented from deteriorating as a consequence of a reduction in the carrier density of the p-type GaAs contact layer 58.

Furthermore, the impurity Zn evaporated from the p-type GaAs contact layer 58 does not readhere to the surface of the exposed n-type GaAs substrate 51. Accordingly, there is no possibility of the formation of the layer where the GaAs substrate 51 is mixed with the readhering impurity Zn at the interface between the lowermost n-type GaAs buffer layer 62 of the AlGaInP-based semiconductor laser 69 and the GaAs substrate 51 when the AlGaInP-based semiconductor laser 69 is formed on the GaAs substrate 51 in the region from which the AlGaAs-based semiconductor laser 59 is removed. Accordingly, there is no possibility of an increase in the heating value as a consequence of an increase in the internal resistance, and the reliability in long-term operation can be improved.

Furthermore, in the present embodiment, the AlGaAs-based non-doped etching stop layer 60 of the different composition is provided between the p-type GaAs contact layer 58, which is the uppermost layer of the AlGaAs-based semiconductor laser 59, and the non-doped GaAs protective layers 61 of the same GaAs system. Therefore, by using an etchant of HF system or hydrochloric acid system having selectivity to the GaAs layer when the non-doped AlGaAs etching stop layer 60 is removed, the etching can be stopped when the p-type GaAs contact layer 58 is exposed. That is, the thickness of the p-type GaAs contact layer 58 can be strictly controlled, and the prescribed contact characteristic can be obtained.

In the above case, the film thickness of the non-doped AlGaAs etching stop layer 60 is set at 0.1 μm. Therefore, the etching can reliably be stopped when the non-doped GaAs protective layer 61 is removed by etching, and the etching stop layer can easily be removed by etching when the GaAs contact layer 58 of the AlGaAs-based semiconductor laser 59 is exposed.

Although the film thickness of the non-doped GaAs protective layer 61 is also set at 0.2 μm in the present embodiment, the film thickness is only required to be not smaller than 0.2 μm similarly to the case of the first embodiment. Although there is no specific limitation on the upper limit, the proper thickness is practically not greater than 2 μm. Furthermore, although the film thickness of the non-doped AlGaAs etching stop layer 60 is set at 0.1 μm in the present embodiment, the present invention is not limited to this. What is essential is that the film thickness is only required to be able to reliably stop the etching when the non-doped GaAs protective layer 61 is etched with an etchant of, for example, $NH_3$ system and the etching reaches the non-doped AlGaAs etching stop layer 60, and the thickness is only required to be not smaller than 0.1 μm. Although there is no specific limitation on the upper limit, the proper thickness is practically not greater than 1 μm.

(Third Embodiment)

In the present embodiment, an AlGaInP-based semiconductor laser is grown on a GaAs substrate by first-time crystal growth, and then an AlGaAs-based semiconductor laser is grown by second-time crystal growth. In the above case, the conductive type of the semiconductor laser by the first-time crystal growth and the conductive type of the semiconductor laser by the second-time crystal growth are reversed in contrast to the case of the second embodiment, and the first-time crystal growth is changed from MOCVD of the second embodiment to the MBE (Molecular Beam Epitaxy) method. A simple description is provided below.

First of all, an AlGaInP semiconductor laser is grown on a p-type GaAs substrate by the MBE method similarly to the case of FIG. 3C (note that the conductive types are reversed). In the above case, the uppermost n-type GaAs contact layer is doped with Si so that the carrier density becomes $5\times10^{18}$ cm$^{-3}$. Then, a non-doped AlGaAs etching stop layer having a film thickness of 0.1 μm and a non-doped GaAs protective layer having a film thickness of 0.2 μm are grown on an n-type GaAs contact layer of the AlGaInP-based semiconductor laser.

Next, a partial region of the AlGaInP-based semiconductor laser formed on the p-type GaAs substrate is removed by etching to expose the p-type GaAs substrate. In concrete, etching is first carried out until reaching the p-type AlGaInP clad layer with an etchant of SBW (Saturated Bromine Water) system. Next, the remaining p-type AlGaInP clad layer is removed by etching with an etchant of HCl system. In this case, since GaAs cannot be etched with the above etchant of HCl system, the etching stops at the surface of the p-type GaAs buffer layer. Accordingly, the p-type GaAs buffer layer is subsequently removed by etching with an etchant of $NH_3$ system or sulfuric acid system to expose the p-type GaAs substrate.

In this case, the non-doped AlGaAs etching stop layer and the non-doped GaAs protective layer are grown on the n-type GaAs contact layer, which belongs to the AlGaInP-based semiconductor laser and is remaining on the p-type GaAs substrate. Therefore, when the p-type GaAs substrate is put in a growth furnace for growing the AlGaAs-based semiconductor laser, the evaporation of the impurity Si from the n-type GaAs contact layer due to high temperature in the furnace is prevented. Further, no dopant is contained in the non-doped GaAs protective layer. As a result, impurities such as the impurity Si evaporated from the n-type GaAs contact layer are prevented from readhering onto the exposed p-type GaAs substrate.

Next, similarly to the case of FIG. 3A (note that the conductive types are reversed), an AlGaAs-based laser is grown on the entire surface by the MOCVD method. Thus, second-time crystal growth is carried out.

Next, a region, which belongs to the succeedingly formed AlGaAs-based semiconductor laser and is formed while being superposed on the precedingly formed the AlGaInP-based semiconductor laser, the non-doped AlGaAs etching stop layer and the non-doped GaAs protective layer are removed by etching.

In concrete, etching is first carried out until reaching the p-type AlGaAs clad layer of the succeedingly formed AlGaAs-based semiconductor laser with an etchant of sulfuric acid system. Thus, if an AlGaAs guide layer exists with interposition of the n-type GaAs contact layer, the upper n-type AlGaAs clad layer, the AlGaAs-based active layer and the active layer in the AlGaAs-based semiconductor laser, then the guide layer is removed. Subsequently, the p-type AlGaAs clad layer is etched to the p-type GaAs buffer layer with an etchant of HF system or hydrochloric acid system. Subsequently, the p-type GaAs buffer layer and the non-doped GaAs protective layer are removed by etching with an etchant of $NH_3$ system. In this case, since the $NH_3$ system etchant is used, the etching stops when the non-doped AlGaAs etching stop layer is exposed. Then, subsequently, the non-doped AlGaAs etching stop layer is removed with an etchant of HF system. Thus, the n-type GaAs contact layer of the AlGaInP-based semiconductor laser is exposed.

Further, a portion located at the boundary between the AlGaInP-based semiconductor laser and the AlGaAs-based semiconductor laser is removed, forming a semiconductor laser device in which the AlGaInP-based semiconductor laser and the AlGaAs-based semiconductor laser are arranged parallel on the p-type GaAs substrate.

Subsequently, ridge portions are formed on the AlGaInP-based semiconductor laser and the AlGaAs-based semiconductor laser, and an n-type electrode is formed on both the ridge portions. Further, a p-type electrode is formed on the surface of the p-type GaAs substrate. Thus, the semiconductor laser device, which has two light-emitting portions, is formed.

As described above, in the present embodiment, the AlGaInP-based semiconductor laser is formed on the p-type GaAs substrate, and thereafter, the non-doped AlGaAs etching stop layer having a film thickness of 0.1 μm and the non-doped GaAs protective layer having a film thickness of 0.2 μm are formed. Therefore, when the p-type GaAs substrate is put in the growth furnace for growing the AlGaAs-based semiconductor laser after the p-type GaAs substrate is exposed by removing by etching the partial region of the AlGaInP-based semiconductor laser, the evaporation of the impurity Si from the n-type GaAs contact layer due to high temperature in the furnace is prevented. Therefore, it is feasible to prevent the characteristic of contact with the n-type electrode from deteriorating as a consequence of a reduction in the carrier density of the n-type GaAs contact layer.

Although the film thickness of the non-doped GaAs protective layer is also set at 0.2 μm in the present embodiment, the thickness is only required to be not smaller than 0.2 μm similarly to the cases of the aforementioned embodiments. Moreover, although the film thickness of the non-doped AlGaAs etching stop layer is set at 0.1 μm, the thickness is only required to be not smaller than 0.1 μm similarly to the case of the second embodiment.

Furthermore, the impurity Si evaporated from the n-type GaAs contact layer does not readhere to the surface of the exposed p-type GaAs substrate. Accordingly, there is no possibility of the formation of the layer where the readhering impurity Si is mixed with the p-type GaAs substrate at the interface with the p-type GaAs substrate when the AlGaAs-based semiconductor laser is formed. Accordingly, there is no possibility of an increase in the heating value as a consequence of an increase in the internal resistance, and the reliability in long-term operation can be improved.

Furthermore, in the present embodiment, similarly to the second embodiment, the GaAs-based non-doped AlGaAs etching stop layer of the different composition is provided between the n-type GaAs contact layer and the non-doped GaAs protective layer of the same GaAs system. Therefore, by using an etchant having selectivity to the GaAs layer when the non-doped AlGaAs etching stop layer is removed, the etching can be reliably stopped when the n-type GaAs contact layer is exposed. That is, the thickness of the n-type GaAs contact layer can be strictly controlled, and the prescribed contact characteristic can be obtained.

This invention is limited to none of the aforementioned embodiments, and it is, of course, acceptable to variously combine the growth methods, the crystal compositions and the conductive types with one another. In the above case, it is proper to set the crystal compositions of the non-doped protective layer and the etching stop layer so that the respective functions are effectively put into effect according to the crystal compositions of the contact layer of the precedingly formed first semiconductor laser layer.

Moreover, the aforementioned embodiments have been described taking the case where two semiconductor laser layers are formed on an identical semiconductor substrate as an example. However, it is also possible to form three or more semiconductor laser layers on an identical semiconductor substrate by repetitively combining the processes described in connection with the embodiments. For example, when the AlGaInP-based semiconductor laser 38 is grown in FIG. 1C, a non-doped GaAs protective layer is further formed on the GaAs contact layer 37. Then, in removing the AlGaInP-based semiconductor laser 38 located on the AlGaAs-based semiconductor laser 29, the non-doped GaAs protective layer 30 is left. Subsequently, if the processes of FIG. 1B through FIG. 2F are carried out by regarding the AlGaInP-based semiconductor laser 38 formed at the second time as a semiconductor laser layer formed at the first time, then three semiconductor laser layers can be formed on an identical n-type GaAs substrate 21.

As is apparent from the above, the fabricating method of a semiconductor laser device having a plurality of light-emitting regions of this invention forms the non-doped semiconductor layer after the formation of the first semiconductor laser layer by the first-time crystal growth on the semiconductor substrate. Therefore, when the semiconductor substrate is exposed by removal except for the region that becomes the light-emitting region of the first semiconductor laser layer prior to the formation of the second semiconductor laser layer by the second-time crystal growth, the contact layer can be protected by the non-doped semiconductor layer. Therefore, when the device is put in the growth furnace to carry out the second-time crystal growth, the evaporation of the impurity from the contact layer due to high temperature in the furnace can be prevented. That is, according to this invention, it is feasible to prevent the characteristic of contact with the metal electrode from deteriorating as a consequence of a reduction in the carrier density of the contact layer.

Furthermore, it is also feasible to prevent the impurity evaporated from the contact layer from readhering to the surface of the exposed semiconductor substrate. Accordingly, there is no possibility of the formation of a layer where the semiconductor substrate is mixed with the readhering impurity at the interface between the lowermost layer of the second semiconductor laser layer formed on the exposed semiconductor substrate and the semiconductor substrate, and the reliability in long-term operation can be improved.

Moreover, it is preferable to form a semiconductor layer of a different crystal composition on the contact layer of the first semiconductor laser layer and to form the non-doped semiconductor layer on this semiconductor layer of the different crystal composition. In the above case, by removing by etching the semiconductor layer of the different crystal composition with an etchant having selectivity to the contact layer in exposing the contact layer, the etching can reliably be stopped at the surface of the contact layer, allowing the layer thickness of the contact layer to be strictly controlled. Therefore, the prescribed contact characteristic can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device fabricating method for forming a semiconductor laser device having a plurality of light-emitting regions, comprising:

forming on a semiconductor substrate a first semiconductor laser comprising a contact layer located in an uppermost position;

forming a non-doped semiconductor layer on the contact layer of the first semiconductor laser layer;

exposing the semiconductor substrate by removing a region of the first semiconductor laser layer and non-doped semiconductor layer, wherein a non-removed region of the first semiconductor laser layer becomes a light-emitting region;

forming a second semiconductor laser layer on the non-removed section of the first semiconductor laser layer and non-doped semiconductor layer and on the exposed semiconductor substrate; and exposing a region of the contact layer of the first semiconductor laser layer by removing a region of the second semiconductor laser layer, wherein a non-removed section of the second semiconductor laser layer becomes a light-emitting region.

2. The semiconductor laser device fabricating method as claimed in claim 1, wherein at least the forming the non-doped semiconductor layer, the exposing the semiconductor substrate and the forming the second semiconductor laser layer are repetitively carried out.

3. The semiconductor laser device fabricating method as claimed in claim 1, further comprising:

forming a semiconductor layer from a crystal composition different from those of the contact layer and the non-doped semiconductor layer before forming the non-doped semiconductor layer on the contact layer of the first semiconductor laser layers.

4. The semiconductor laser device fabricating method as claimed in claim 3, wherein an AlGaAs-based semiconductor layer is formed as the semiconductor layer of the different crystal composition.

5. The semiconductor laser device fabricating method as claimed in claim 1, wherein a GaAs-based semiconductor layer is formed as the non-doped semiconductor layer.

6. The semiconductor laser device fabricating method as claimed in claim 4, wherein a GaAs-based semiconductor layer is formed as the non-doped semiconductor layer.

7. The semiconductor laser device fabricating method as claimed in claim 6, wherein the GaAs-based non-doped semiconductor layer has a thickness of not less than 0.2 $\mu$m, and the AlGaAs-based semiconductor layer has a thickness of not smaller than 0.1 $\mu$m.

8. The semiconductor laser device fabricating method as claimed in claim 5, wherein a GaAs-based contact layer is formed as the contact layer of the first semiconductor laser layer.

9. The semiconductor laser device fabricating method as claimed in claim 6, wherein a GaAs-based contact layer is formed as the contact layer of the first semiconductor laser layer.

* * * * *